US009523157B2

(12) United States Patent
Pogorelsky et al.

(10) Patent No.: US 9,523,157 B2
(45) Date of Patent: Dec. 20, 2016

(54) METHOD FOR GROWING AN AlN MONOCRYSTAL AND DEVICE FOR IMPLEMENTING SAME

(76) Inventors: Mikhail Yurievich Pogorelsky, Saint-Petersburg (RU); Alexei Petrovich Shkurko, Saint-Petersburg (RU); Alexei Nikolaevich Alexeev, pos. Roschino (RU); Viktor Petrovich Chaly, Saint-Petersburg (RU)

( * ) Notice: Subject to any disclaimer, the term of this patent is extended or adjusted under 35 U.S.C. 154(b) by 469 days.

(21) Appl. No.: 14/126,449

(22) PCT Filed: May 17, 2012

(86) PCT No.: PCT/RU2012/000397
§ 371 (c)(1),
(2), (4) Date: Jun. 30, 2014

(87) PCT Pub. No.: WO2012/173520
PCT Pub. Date: Dec. 20, 2012

(65) Prior Publication Data
US 2014/0331918 A1    Nov. 13, 2014

(30) Foreign Application Priority Data

Jun. 15, 2011    (RU) ................................ 2011124267

(51) Int. Cl.
*C30B 25/08* (2006.01)
*C30B 25/18* (2006.01)
(Continued)

(52) U.S. Cl.
CPC ........... *C30B 25/186* (2013.01); *C23C 14/243* (2013.01); *C30B 23/02* (2013.01); *C30B 25/08* (2013.01);
(Continued)

(58) Field of Classification Search
CPC .......... C30B 23/02; C30B 25/02; C30B 29/38; C30B 25/08; C30B 35/002; C23C 14/243
See application file for complete search history.

(56) References Cited

U.S. PATENT DOCUMENTS 4,662,981 A * 5/1987 Fujiyasu ............... C30B 23/066
117/105
6,063,185 A * 5/2000 Hunter .................... C30B 23/00
117/105

(Continued)

*Primary Examiner* — Matthew Song
(74) *Attorney, Agent, or Firm* — John D. Gugliotta

(57) ABSTRACT

The invention relates to the technology for producing three-dimensional monocrystals and can preferably be used in optoelectronics for manufacturing substrates for various optoelectronic devices, including light-emitting diodes that emit light in the ultraviolet region. The method for growing an AlN monocrystal by gas-phase epitaxy from a mixture containing a source of Al and $NH_3$ comprises arranging the Al source and a substrate, with the growth surface of said substrate turned towards said Al source, opposite one another in a growth chamber, said source and substrate forming a growth zone, producing a flow of $NH_3$ in the growth zone; and heating the Al source and the substrate to temperatures that ensure the growth of the AlN monocrystal on the substrate. The Al source used is only free Al, the substrate is pretreated with Ga and/or In, whereupon the Al source is cooled to a temperature of 800-900° C. and the substrate is annealed by being heated to a temperature of 1300-1400° C. with subsequent cooling of said substrate to the nitriding temperature of the growth surface of said substrate. The invention ensures a reduction in the extent of flaws in the AlN monocrystal being grown.

3 Claims, 3 Drawing Sheets

(51) Int. Cl.
*C30B 23/02* (2006.01)
*C23C 14/24* (2006.01)
*C30B 29/38* (2006.01)
*C30B 29/40* (2006.01)
*C30B 25/14* (2006.01)

(52) U.S. Cl.
CPC ............... *C30B 25/14* (2013.01); *C30B 29/38* (2013.01); *C30B 29/403* (2013.01)

(56) References Cited

U.S. PATENT DOCUMENTS

| | | | |
|---|---|---|---|
| 6,375,739 B1* | 4/2002 | Mullins | C30B 23/00 117/104 |
| 2003/0136333 A1* | 7/2003 | Semond | C30B 23/02 117/95 |

* cited by examiner

METHOD FOR GROWING AN AlN MONOCRYSTAL AND DEVICE FOR IMPLEMENTING SAME

TECHNICAL FIELD

The present inventions relate to the technology for producing three-dimensional monocrystals and can preferably be used in optoelectronics for manufacturing substrates for various optoelectronic devices, including light-emitting diodes that emit light in the ultraviolet region.

BACKGROUND ART

A known method for epitaxial growing of an AlN monocrystal comprises supplying vapors of Al and $N_2$ to a growth chamber, with the pressure of $N_2$ being above the stoichiometric pressure and the total pressure in the chamber being above the atmospheric pressure. At least one nucleation center is placed in the chamber, and said center is cooled down relative to the other contents of the growth chamber. Then the vapor of Al and $N_2$ is supplied to the chamber for growing AlN at the nucleation site, see U.S. Pat. No. 6,770,135 B2.

The main disadvantage of said method consists in that the source material for growing an AlN monocrystal is AlN powder that requires extremely high temperature (2000-2500° C.) for decomposition thereof, which drastically increases the equipment costs, because expensive very high-temperature and hard-to-process construction materials have to be used in addition, using the source material in the form of a powder results in it being oxidized by oxygen in the air prior to the start of process, which increases the number of flaws in the obtained product and results in insufficient transparency.

Another known method for epitaxial growing of monocrystalline aluminum nitride from a mixture of aluminum vapors and nitrogen comprises arranging a substrate and the Al source opposite one another in a growth chamber, heating and maintaining working temperatures of said source and said substrate that ensure, respectively, the production of aluminum vapors within the mixture and the growth of aluminum nitride monocrystal on the substrate; the pressure of the mixture of nitrogen and aluminum vapor in the growth chamber is maintained within 400 mbar from the lower value that equals the pressure created in a closed space by a stoichiometric mixture of nitrogen and aluminum vapors that is produced through evaporation of the source material, said mixture having the 1:1 ratio of concentrations of nitrogen and aluminum atoms, see RU 2158789 C1.

The disadvantage of said method consists in the utilization of molecular nitrogen, the temperature of decomposition of which into atoms on a hot surface equals 2000-2500° C.; in order to allow carrying out this process at such high temperatures, a material is used that contacts the growth zone, said material being embodied as a solid solution of tantalum carbide in tantalum; at high temperatures the carbon contained the tantalum carbide enters the content of the obtained product that leads to the emergence of flaws in the AlN monocrystal.

The abovementioned methods relate to methods for epitaxial growing of an AlN monocrystal through sublimation of the source materials. As specified above, these methods require very high temperatures for the implementation thereof.

There are known methods for epitaxial growing of an AlN monocrystal by gas-phase epitaxy.

RU 2158789 C1 describes a method for epitaxial growing of an AlN monocrystal by gas-phase epitaxy, in which the nitrogen source is embodied as molecular nitrogen, and the source of aluminum is embodied as free Al. The disadvantage of said method, along with all other methods in which molecular nitrogen is used, consists in the fact that said methods are implemented at quite high temperatures in the growth zone (in practice, at not lower than 2000° C.), which requires special equipment made of high-temperature materials that are treated using specialized complex technologies. In particular, parts made of tungsten and its alloys that are used in such equipment are produced using quite expensive methods of powder metallurgy.

In certain other known methods for epitaxial growing of an AlN monocrystal by gas-phase epitaxy the nitrogen source is implemented not as molecular nitrogen but as a compound thereof—ammonia ($NH_3$), and the Al source is embodied as a mixture of free Al and AlN. These methods are implemented at lower temperatures.

In particular, in a known method for epitaxial growing of a monocrystal of nitrides of metals of 3A group of chemical elements, including a monocrystal of AlN, the Al source is embodied as a mixture containing free Al and a nitride component—AlN, and the nitrogen source is embodied as $NH_3$. The Al source and a substrate, with the growth surface of said substrate turned towards said Al source, are arranged opposite one another in a growth chamber, said source and substrate forming a growth zone. A flow of $NH_3$ is supplied to the growth zone on the side through a porous crucible and between the grains of the mixture of Al and AlN, and the mixture of Al and AlN and the substrate are heated to temperatures that ensure the growth of the monocrystal on the substrate, see RU 2097452 C1.

This technical solution has been taken as a prototype of the method of the present invention.

In this method, as in other known methods, the Al source can only be embodied as a mixture of free Al and AlN. If only free (metallic) Al is used in the prototype method then the passing of $NH_3$ through the metallic aluminum melt causes the formation of a layer of solid AlN on the melt surface, which blocks the evaporation of Al at temperatures that correspond to evaporation of metallic aluminum. In order to evaporate said layer of AlN, the temperature would have to be increased to ≥1800° C., which would effectively nullify all advantages of the method that uses $NH_3$. Therefore in the known methods that use $NH_3$ as the nitrogen source, free Al has not been used as the Al source, and the Al source has been embodied as a mixture of Al and AlN.

However, combined utilization of free Al and AlN as an Al source is only possible in the form of a powder mixture of AlN and free (metallic) Al. Said powder has quite large total surface area of particles, which results in intensive formation of oxides due to a reaction with the oxygen in the air over a large surface, contamination of the obtained material—AlN monocrystal and, correspondingly, causes high extent of flaws thereof, up to the point where the obtained material is not monocrystalline but polycrystalline. Besides, using a mixture of free Al and AlN as the Al source leads to other negative consequences as well. AlN in a vacuum growth chamber evaporates at t°≥1800° C. (see http://en.wikipedia.org/wiki/Aluminium_nitride), whereas Al starts to evaporate at t°=1050° C. During the heating of the Al and AlN mixture to t°≥1800° C. the metallic Al will melt and will start evaporating and escaping much sooner that the evaporation of AlN will start, therefore in the prototype method the growth of AlN monocrystal will take place during all stages at quite high growth rate. That said, at the initial stage of growing of an AlN monocrystal it is very important to ensure that the number of flaws in the first layers of the monocrystal is minimal, wherein said number of flaws increases upon increasing the growth rate of the AlN monocrystal, which is directly proportional to the temperature of Al source.

In addition, the necessity of heating the source mixture of Al and AlN to high; temperatures requires using quite expensive construction materials for building the growth chamber and the elements arranged therein. The fact that the prototype method does not comprise pretreating the growth surface of the substrate also increases the number of flaws in the AlN monocrystal and may result in an unacceptable discoloration thereof, to the extent that it may become amber brown. This makes the AlN monocrystal unsuitable, in particular, for using in the ultraviolet range.

A known device for implementing the method for growing an AlN monocrystal by gas-phase epitaxy comprises a body, a growth zone heater, a substrate holder, a crucible for arranging the Al source in the form of a cylindrical chamber and an Al source heater, see RU 2158789 C1.

This technical solution has been taken as a prototype of the device of the present invention.

Its disadvantage, same as for the device used in RU 2097452 C1, consists in the fact that $NH_3$ comes in directly contact with the Al source, which does not allow using free Al as the Al source due to the formation of a layer of solid AlN on the Al melt surface upon its contact with $NH_3$, which blocks the evaporation of Al.

SUMMARY OF THE INVENTION

It is an object of the method of the present invention to reduce the extent of flaws in the AlN monocrystal being grown.

According to the invention there is provided a method for growing an AlN monocrystal by gas-phase epitaxy from a mixture containing an Al source and $NH_3$, which comprises arranging the Al source and a substrate, with the growth surface of said substrate turned towards said Al source, opposite one another in a growth chamber, said source and substrate forming a growth zone, producing a flow of $NH_3$ in the growth zone; heating the Al source and the substrate to temperatures that ensure the growth of Al monocrystal on the substrate; and wherein the Al source used is only free Al, the substrate is pretreated with Ga and/or In, whereupon the Al source is cooled to a temperature of 800-900° C. and the substrate is annealed by being heated to a temperature of 1300-1400° C. with subsequent cooling of said substrate to the nitriding temperature of the growth surface of said substrate; after cooling said substrate to the nitriding temperature of the growth surface thereof $NH_3$ is supplied to the growth zone during 8-15 minutes and then the Al source temperature is increased and, together with $NH_3$, Al vapors are supplied to the growth zone; at the initial growing stage the AlN monocrystal is grown at a rate not more than 10 μm/h until reaching a thickness of 1-10 μm, whereupon the growth rate is increased to 100-200 μm/h.

It is an object of the device of the present invention to provide a device for implementing the method for growing an AlN monocrystal using $NH_3$, which would eliminate any contact between $NH_3$ and aluminum in liquid phase and the subsequent formation of a solid layer of AlN on the melt surface; the claimed device allows implementing the method in which the nitrogen source is $NH_3$, and the Al source used is only free Al.

According to the invention the device for implementing the method for growing an AlN monocrystal by gas-phase epitaxy from a mixture containing an Al source and $NH_3$ comprises a vacuum chamber that contains a body, a growth zone heater, a substrate holder, a crucible for arranging the Al source and an Al source heater, wherein said crucible for arranging the Al source is embodied as a toroid-shaped tank that is open on the side of the growth zone and is installed inside a shielding chamber fitted with a lid, which is arranged in the lower part of the body and communicates with the source of $NH_3$ supply, and wherein there are holes made in the lid of the shielding chamber opposite the central opening of the crucible and the Al source.

The applicant has not found any sources of information containing data on technical solutions identical to the inventive method and the device for implementing same, which enables to conclude that the inventive method and the inventive device conform to the criterion "Novelty" ("N").

The implementation of the features of the claimed method by means of the claimed device allows using only free Al together with $NH_3$, which ensures important novel properties of the technology for epitaxial growing of an AlN monocrystal. The fact that the claimed device ensures the passing of $NH_3$ through the central opening in the toroid-shaped crucible eliminates any contact between $NH_3$ and the Al melt and prevents the formation of a solid layer of AlN on the melt surface. The fact that only free Al is used as the Al source significantly reduces the surface area that contacts with oxygen, which considerably lowers the intensity of oxides formation and the contamination of the obtained product—an AlN monocrystal, and reduces the extent of flaws thereof. In addition, using only free Al as the Al source allows significantly reducing the temperature in the Al source area as compared to the prototype method (from ≥1800° C. down to 1050-1400° C.). The temperature in the Al source area is directly proportional to the growth rate of the AlN monocrystal; reducing this rate at the initial stage of growth allows ensuring minimal number of flaws in the first buffer layers of the AlN monocrystal that to a large extent determine the overall quality of the monocrystal.

The pretreatment of the growth surface of the substrate with Ga and/or In results in "healing" of surface flaws thereof, because atoms of Ga and/or In are incorporated into free dangling bonds in the flawed areas, which prevents the flaws from spreading further.

The annealing of the substrate at a temperature of 1300-1400° C. with subsequent cooling to the nitriding temperature of the substrate surface ensures evaporation of oxides and contaminations from the substrate in air atmosphere that could not be removed at previous stages of the surface preparation; subsequent supply of $NH_3$ to the growth area for 8-15 minutes makes the growth surface of the substrate more suitable for monocrystal growth, because $NH_3$ molecules hit the hot surface of the substrate, $NH_3$ decomposes, producing nitrogen atoms and hydrogen atoms, hydrogen catches oxygen atoms from the near-surface layer, and the vacant sites become occupied by nitrogen atoms.

Growing the AlN monocrystal during the initial growing stage until reaching a thickness of 1-10 μm at low growth rate—not more than 10 μm/h, and then at a growth rate of 100-200 μm/h allows reducing the extent of flaws of the product and also ensures high overall productivity of the process.

The applicant has not found any sources of information containing data on the influence of the features of the claimed method and claimed device on the technical result produced by the implementation thereof, which enables to conclude that the group of inventions conforms to the criterion "Inventive Step" ("IS").

BRIEF DESCRIPTION OF THE DRAWINGS

The group of inventions is further explained, by way of example, with reference to the following drawings, in which.

PREFERRED EMBODIMENT

Figure 1:
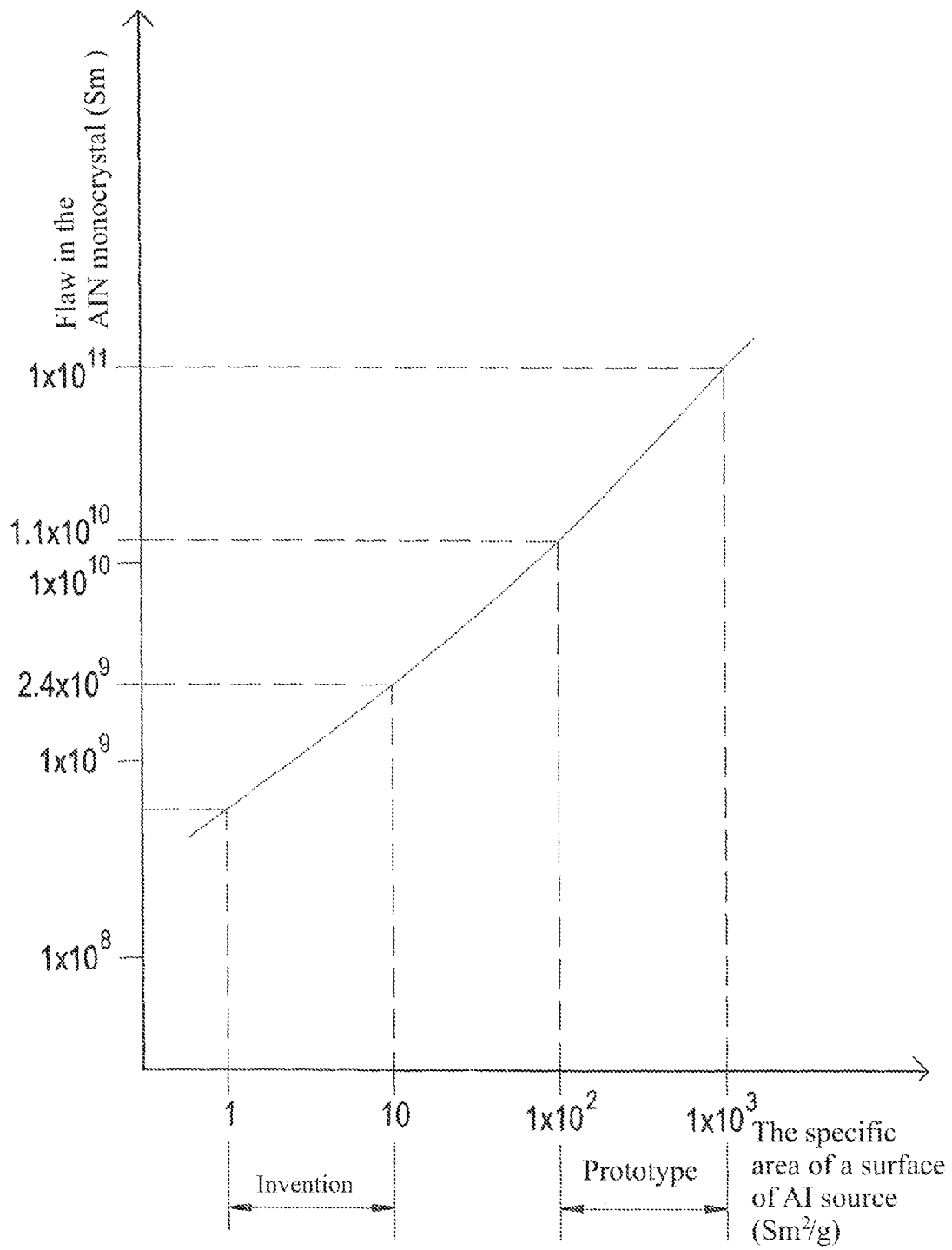
FIG. 1 is a graph that illustrates the dependence of the extent of flaws in the grown AlN monocrystal on the specific area of the surface of the Al source.
Figure 2:
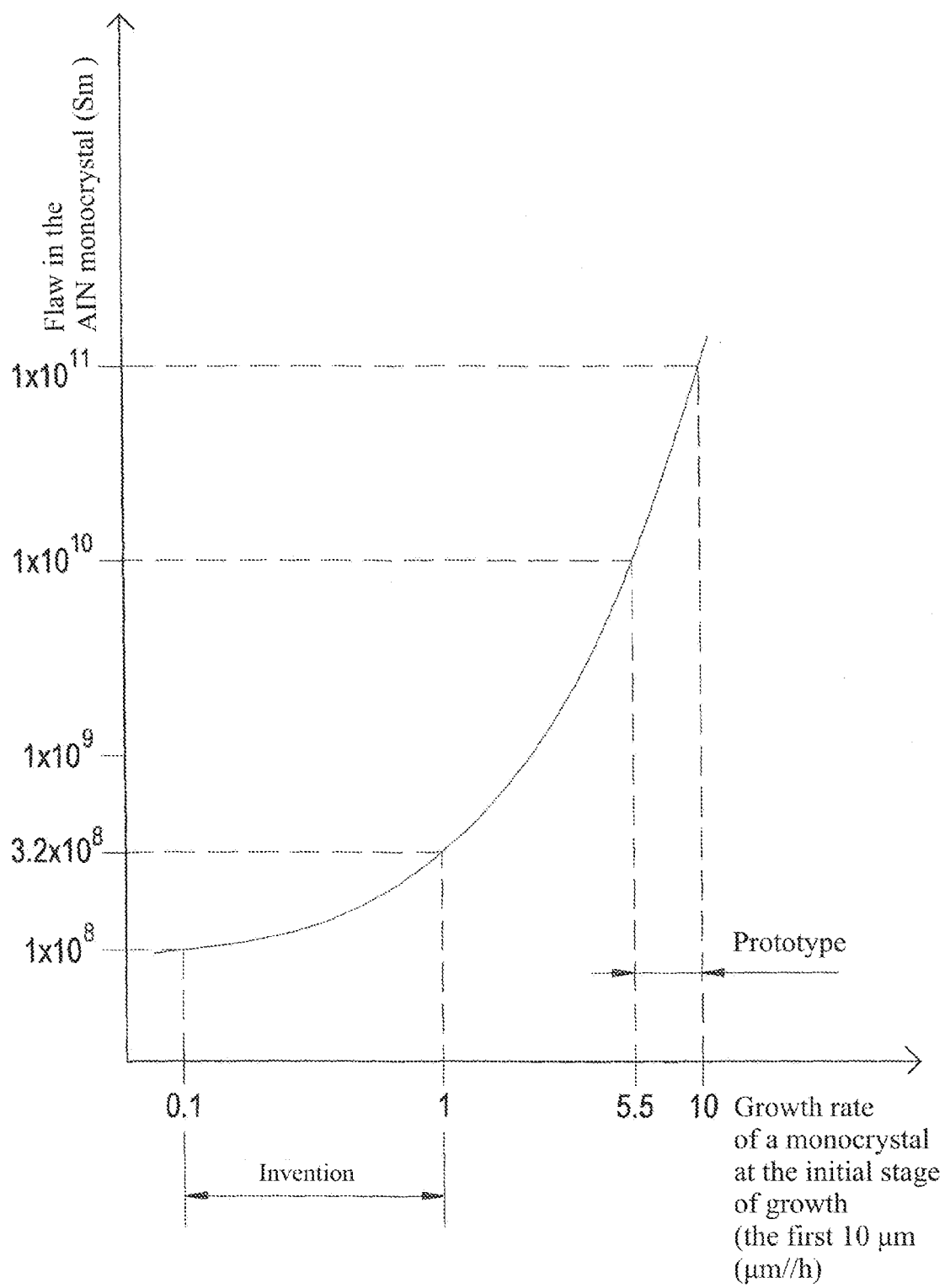
FIG. 2 is a graph that illustrates the dependence of the extent of flaws in the AlN monocrystal on its growth rate at the initial growth stage.
Figure 3:
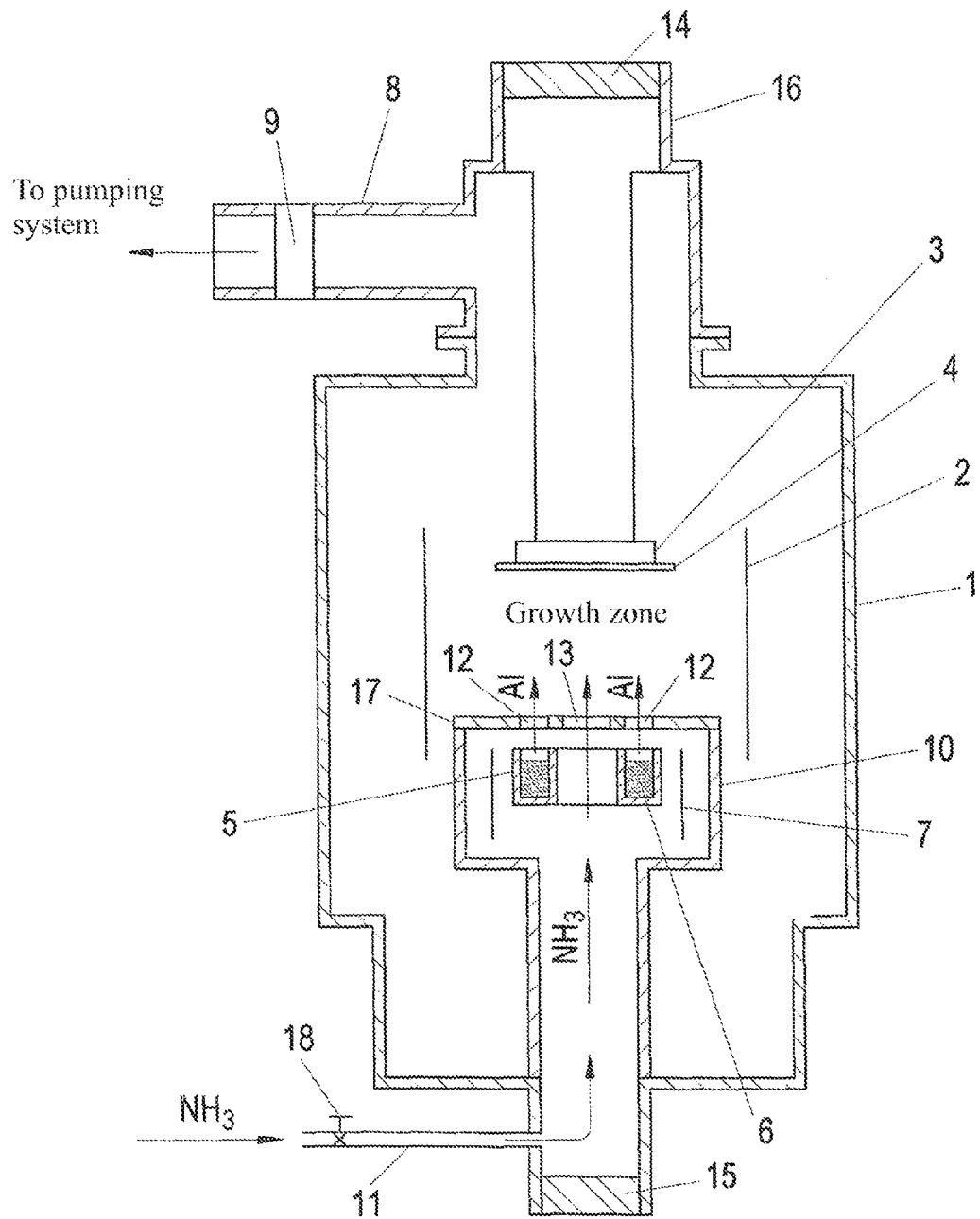
FIG. 3 is a scheme of the device for implementing the method for growing an AlN monocrystal, shown in a longitudinal section.

The device for implementing the claimed method comprises a vacuum chamber that contains a body 1 made of stainless steel, a heater 2 of resistive type for the growth area, which is made of a tungsten-rhenium alloy, a holder 3 for a substrate 4, in this particular embodiment a sapphire substrate, a crucible 5 for arranging the Al source 6, which is embodied as a toroid-shaped tank made of high-temperature gas-tight ceramics, a heater 7 for the Al source 6, of a resistive type, made of molybdenum. The air and the operating atmosphere are pumped out during the process through a pipeline 8 by means of a turbomolecular pump with controlled speed of rotation TMP-803 MC manufactured by company Shimadzu (Japan), not shown in the figure. The pipeline 8 is provided with a controlled damper 9 64244-CE52 manufactured by company VAT (Switzerland).

The crucible 5 is installed inside a shielding chamber 10 that is arranged in the lower part of the body 1 and communicates through a pipeline 11 with the source of ammonia supply—a cylinder with liquid ammonia, which is provided with a reducing valve and a flow regulator (not shown). Holes 12 are made circumferentially in the lid 17 of the shielding chamber 10 opposite the Al source, and a hole 13 is made opposite the central opening of the crucible 5. In the upper part of the body 1 a glass 14 is installed, and in the lower part of the body 1 a glass 15 is installed. The glass 14, 15 is heat-resistant and optically transparent in the infra-red range.

The inventive method is implemented in the following way. The upper part 16' of the body 1 is removed. The substrate 4 is arranged on the holder 3; the lid 17 is removed and metallic Al is loaded into the crucible 5 in the form of pieces 5-10 mm in size (~30-40 g in weight), also several pieces of Ga and/or In with total mass of ~1.5-2 g are loaded to said crucible, in this particular embodiment—pieces of Ga. The upper part 16 of the body 1 is installed and the cavity of body 1 is evacuated until obtaining pressure of $10^{-8}$ Pa; heaters 2 and 7 are turned on, the crucible 5 is heated to a temperature of 1050-1150° C. and the substrate 4 is heated to a temperature that is ~50° C. higher than the temperature of crucible 5. Ga evaporates from the crucible 5 and modifies the growth surface of the substrate 4, wherein the Ga atoms are incorporated into free dangling bonds in the flawed areas, which prevents the flaws from spreading further during the process of AlN monocrystal growth. The crucible 5 is cooled to 800-900° C. in order to prevent the evaporation of Al and prevent its vapors from getting on the growth surface of the substrate 4. Then the substrate 4 is heated to a temperature of 1300-1400° C. by annealing it for 5-10 minutes. Then the substrate is cooled to the nitriding temperature of its growth surface—950-1100° C. Then the valve 18 is opened and $NH_3$ is supplied to the growth zone through the pipeline 11 for 8-15 minutes; then the temperature of crucible 5 is increased to 1050° C. during the initial stage, and wherein the Al vapors are supplied to the growth zone together with $NH_3$.

Due to the fact that the temperature of crucible 5 equals 1050° C., a growth rate of not more than 10 μm/h is ensured during the initial stage of AlN monocrystal growth until it reaches a thickness of 1-10 μm. Then the temperature of the crucible is smoothly increased to 1300° C., which corresponds to the growth rate of 100-200 μm/h. At this time the temperature of the substrate 4 is kept within the limits 1300-1600° C. The temperature of the substrate 4 is measured by means of infra-red pyrometers (not shown) through glass 14 and 15, and the temperature of the crucible 5 is measured by means of a tungsten-rhenium thermocouple (not shown).

INDUSTRIAL APPLICABILITY

The inventions can be implemented by means of known materials and equipment. In applicant's opinion, this enables to conclude that the inventions conform to the criterion "Industrial Applicability" (IA).

The invention claimed is:

1. A method for growing an AlN monocrystal by gas-phase epitaxy from a mixture containing an Al source and NH3, which comprises arranging the Al source and a substrate, with the growth surface of said substrate turned towards said Al source, opposite one another in a growth chamber, said source and substrate forming a growth zone, and producing a flow of NH3 in the growth zone; heating the Al source and the substrate to temperatures that ensure the growth of the Al monocrystal on the substrate, characterized in that the Al source used is only free Al, the substrate is pretreated with Ga and/or In, whereupon the Al source is cooled to a temperature of 800-900° C. and the substrate is annealed by being heated to a temperature of 1300-1400° C. with subsequent cooling of said substrate to the nitriding temperature of the growth surface of said substrate.

2. A method according to claim 1, characterized in that after the substrate is cooled to the nitriding temperature of the growth surface of said substrate, NH3 is supplied to the growth zone during 8-15 minutes and then the Al source temperature is increased and, together with NH3, Al vapors are supplied to the growth zone.

3. A method according to claim 1 or 2, characterized in that during the initial growing stage until reaching a thickness of 1-10 m the AlN monocrystal is grown at a growth rate not more than 10 m/h and then the growth rate is increased to 100-200 m/h.

* * * * *